United States Patent [19]

Hilger et al.

[11] Patent Number: 4,698,292

[45] Date of Patent: Oct. 6, 1987

[54] PHOTOPOLYMERIZABLE RECORDING ROLL MATERIAL WITH END CAPS

[75] Inventors: Manfred Hilger, Konz; Norbert Klein, Wiesbaden, both of Fed. Rep. of Germany

[73] Assignee: Hoechst Aktiengesellschaft, Frankfurt am Main, Fed. Rep. of Germany

[21] Appl. No.: 784,490

[22] Filed: Oct. 4, 1985

[30] Foreign Application Priority Data

Oct. 12, 1984 [DE] Fed. Rep. of Germany ....... 3437453

[51] Int. Cl.$^4$ .............................................. G03C 1/76
[52] U.S. Cl. ..................................... 430/273; 53/137; 156/218; 430/950; 430/961
[58] Field of Search ............... 430/273, 281, 950, 961, 430/500, 501; 53/137; 156/218

[56] References Cited

U.S. PATENT DOCUMENTS

| | | | |
|---|---|---|---|
| 2,158,173 | 5/1939 | Baxter | 430/501 |
| 3,451,818 | 6/1969 | Wareham | 430/500 |
| 3,469,982 | 9/1969 | Celeste | 430/273 |
| 3,867,153 | 2/1975 | MacLachian | 430/281 |
| 3,930,865 | 1/1976 | Faust et al. | 430/281 |
| 4,148,395 | 4/1979 | Syracuse et al. | |
| 4,276,371 | 6/1981 | Scott | 430/501 |
| 4,423,584 | 1/1984 | Elsner et al. | 53/137 |
| 4,565,049 | 1/1986 | Deligt et al. | 53/137 |

*Primary Examiner*—Jack P. Brammer
*Attorney, Agent, or Firm*—Schwartz, Jeffery, Schwaab, Mack, Blumenthal & Evans

[57] ABSTRACT

A photopolymerizable recording material comprising a transparent support film, a thermoplastic photopolymerizable photoresist layer, and a flexible covering film on the exposed surface of the photoresist layer. The material is in the form of a roll. The end faces of the roll are covered with glued-on covering disks to prevent squeezing out of photopolymerizable substance.

11 Claims, 2 Drawing Figures

PHOTOPOLYMERIZABLE RECORDING ROLL MATERIAL WITH END CAPS

BACKGROUND OF THE INVENTION

The present invention relates to a photopolymerizable recording material in the form of a supply roll, in particular a dry photoresist material comprising a support film, a photopolymerizable layer and a covering film.

Materials of the above-mentioned type which are, for example, disclosed in U.S. Pat. No. 3,469,982 are extensively used in the production of printed circuits and in similar applications.

The thermoplastic photoresist layers of these materials must be adapted for dry transferring to another support material, for example a copper plate, with the application of pressure and usually also with heating. Therefore, the photoresist layer must be at least thermoplastically deformable, preferably even plastically deformable at ambient temperature, and it should have a particular tackiness. Materials showing these processing characteristics to an optimum degree present certain problems during storage and transport in the unexposed state, since their photoresist layers invariably tend to some cold flow which becomes apparent when the material is stored in the form of a roll. The photoresist layer then emerges between the film layers at the end faces of the roll and causes the wound-up layers to stick together. In an attempt to solve this problem, the composition of the photoresist layer, in particular the nature of the thermoplastic binder, has been modified to raise the flow temperature of the layer. This way of proceeding, which is described, for example, in German Offenlegungsschrift No. 23 63 806, is limited by the fact that the brittleness of the photo-crosslinked layer increases with the increased flow temperature of the unexposed layer, such that processing of the exposed material is rendered difficult.

Another solution to the problem is described in German Pat. No. 23 45 120. According to this patent, the edges of the photoresist layer are cured, so that the layer can no longer be squeezed out. The method has the disadvantage that, during processing of the respective material, light-sensitive substance is lost in the edge zones, since a particular safe distance must be allotted to ensure that any partly polymerized portions of the layer are excluded from the subsequent exposure and development. In addition, curing of the edge zones can give rise to a change in the relative adhesion of the photoresist layer to the support and covering films, which may produce the unwelcome effect of the layer adhering more firmly to the covering film than to the support film.

SUMMARY OF THE INVENTION

It is accordingly an object of the present invention to provide a photopolymerizable recording material which does not show any adverse squeezing out of the photopolymerizable layer at the material edges, when it is stored in a roll.

It is another object of the invention to provide a recording material, as above, which does not necessitate material losses upon processing.

It is yet another object of the invention to provide a recording material, as above, in which the adhesion of the layer to the support and covering films remains unchanged until the composite structure is separated.

It is still another object of the invention to provide a process for making the above recording material.

These objects are achieved by a photopolymerizable recording material in the form of a roll having end faces, the recording material comprising a removable support film, a photopolymerizable photoresist layer applied to the support film, a flexible covering film applied to the exposed surface of the photoresist layer, the flexible covering film adhering less firmly to the photoresist layer than to the support film, and a separate covering disk adhered to each end face of the roll. The support film is flexible, transparent and dimensionally stable, and the photoresist layer is thermoplastic and transferable from the support film.

The objects of the invention are also achieved by a process for the manufacture of a storable photopolymerizable recording material which comprises the steps of applying a thermoplastic transferable photopolymerizable photoresist layer to a flexible, transparent, dimensionally stable support film, laminating a flexible covering film to the exposed surface of the photoresist layer to produce a composite structure, winding up the composite structure to produce a supply roll having end faces, and adhering a separate covering disk to each of the end faces.

BRIEF DESCRIPTION OF THE DRAWINGS

The accompanying drawings illustrate the recording material of the present invention.

DETAILED DESCRIPTION OF THE PREFERRED EMBODIMENTS

The invention is based on a photopolymerizable recording material comprising a flexible, transparent, dimensionally stable temporary support film, a thermoplastic, transferable, photopolymerizable photoresist layer applied to the support film and a flexible covering film on the other surface of the photoresist layer which adheres less firmly to the photoresist layer than the support film, the material being in the form of a roll.

In the recording material of the present invention, the end faces of the roll are covered by glued-on covering disks.

The invention also provides a process for the manufacture of a storable photopolymerizable recording material. A thermoplastic, transferable photopolymerizable photoresist layer is applied to a flexible, transparent dimensionally stable support film, laminating a flexible covering film to the free surface of the photoresist layer and winding up the composite structure obtained to produce a supply roll.

In the process of the present invention, the end faces of the supply roll are covered by gluing on covering disks.

The covering disks or covering sleeves used generally comprise circular or annular disks of paper, plastic films, textile fabrics, or non-woven fabrics which are coated with an adhesive. The adhesive can either be active at ambient temperature or it can be a hot-melt adhesive.

The covering disks are usually made of a flexible, preferably tear-resistant material, for example, a plastic film or a textile fabric. In this case, the disks can easily be removed again, when desired. It is also possible for the disks to be comprised of a relatively rigid material, for example, paper board or a rigid plastic, when it is desired to impart improved stability to the roll. The disks appropriately have a circular shape corresponding to the diameter of the roll. Preferably, an opening in the form of a concentric inner circle is provided in the disks, such that they can be pushed upon the projecting winding mandrel.

Figure 1:
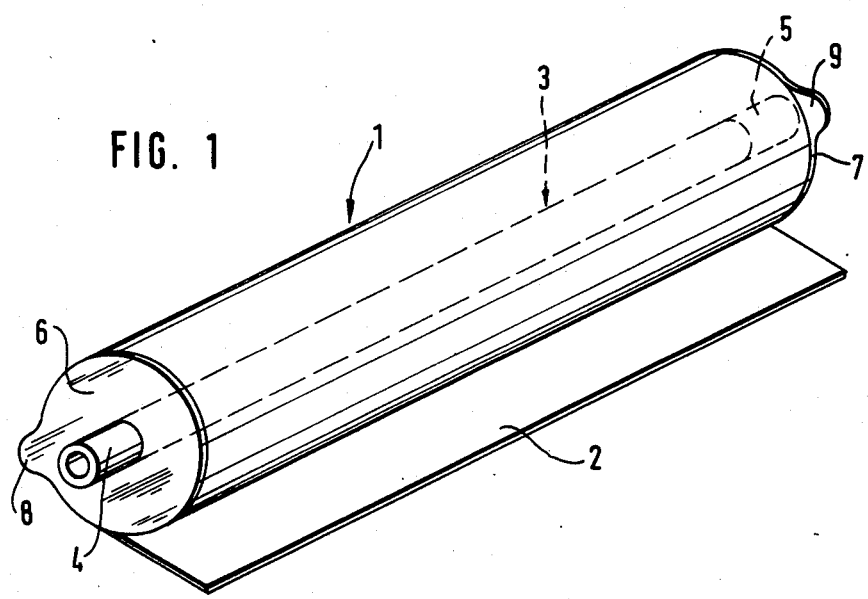
FIG. 1 illustrates a dry resist roll, the end faces of which are provided with detachable covering disks.

FIG. 1 represents a dry resist roll generally indicated by the number 1, which comprises a dry resist film 2 wound upon a winding mandrel 3. The ends of the winding mandrel 3 form journals 4 and 5 which extend beyond the width of the roll. Annular covering sleeves 6 and 7 are glued upon the end faces of the roll. The covering sleeves 6 and 7 have lugs 8 and 9, by means of which they can be removed again when required.

Figure 2:
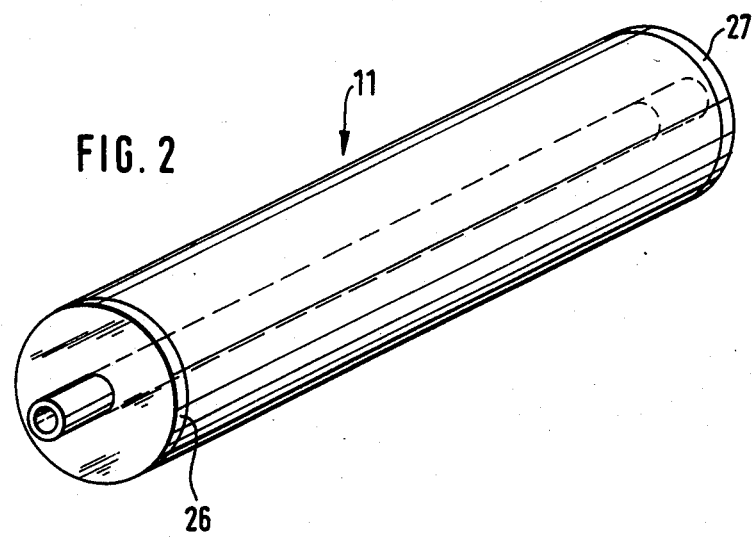
FIG. 2 illustrates a dry resist roll, the end faces of which are provided with rigid covering disks.

FIG. 2 shows a similar dry resist roll 11, the end faces of which are covered with rigid adhesive sleeves 26 and 27.

The covering disks are applied in the course of manufacturing the dry resist material. In the process, a support film which preferably comprises a polyester, is coated with a solution of the photopolymerizable composition and dried. A covering film which preferably comprises a polyolefin is then laminated to the free surface of the photopolymerizable layer. The laminate obtained is wound up into a large size roll. The material is subsequently cut into serviceable widths and lengths. Usually, rolls having widths in the range from about 20 cm to about 80 cm are manufactured, the dimensions of which are such that they can be processed by means of commercial processing equipment. The roll diameter is dependent upon the diameter of the winding mandrel and the thickness of the laminate. At a resist film length from about 100 m to about 300 m, the roll diameter can be from about 8 to about 25 cm.

When manufacturing the rolls, the winding tension must be very carefully monitored. Tension should always remain constant across the width of the roll and also over the entire length of the web which is to be wound up. Varying tensions will result in the squeezing out of layer substance at the places of higher tension and thus in an irregular smudging of the end faces of the roll. If the roll is wound too loosely, the differences in tension can also lead to a mutual displacement ("telescoping") of the layers in the roll. Due to inevitable variations in thickness of the films and the photopolymerizable layer, these unwelcome effects can never be completely obviated.

An annular piece adapted to the diameters of the roll and the winding mandrel is then punched out, for example, from a suitable commercially available self-adhesive film, and is attached to the end face of the roll with the application of pressure. The roll is thus protected from any unwanted squeezing out of layer substance. At the same time, the disk prevents the risk that operating personnel who come into contact with the end faces when handling the rolls, suffer from skin irritations caused by the photopolymerizable acrylic or methacrylic acid esters. The glued-on covering disks also have the advantageous effect of preventing or substantially suppressing any slip, the so-called telescoping, of the layers in the roll. Moreover, light and atmospheric humidity are prevented from acting on the resist layer during storage.

In the use of the recording material, the covering disks are removed from the roll before it is mounted in the laminating device. Minor amounts of layer substance which may have emerged from the end face of the roll during storage are torn off by the adhesive coating of the disk, such that a clean roll end face is obtained. It is also possible to use rigid covering disks which can further suppress the abovementioned telescoping of the roll. In addition, a hotmelt adhesive or a heat-sealing layer can be used instead of an adhesive which is active at ambient temperature. In this case, the covering disks are pressed on while being heated correspondingly. According to a particular embodiment, a thermoplastic photoresist layer, as used in the dry photoresist material, is coated on the covering disk in lieu of a hot-melt adhesive.

Base materials which can be used in manufacturing the covering disks or sleeves, respectively, include films of plastic materials, such as polyester, polyethylene, polypropylene, polyvinyl chloride or the like. It is possible to enhance the dimensional stability of the films by stretching. Paper or paper board, non-woven or textile fabrics are also suitable.

Customary pressure-sensitive acrylate-based adhesives are usually employed in the adhesive coating. As the hot-melt adhesives, polyvinyl acetate, vinyl acetate copolymers, acrylic ester polymers, polybutenes, polyethylenes, copolyesters of isophthalic acid and terephthalic acid and natural resins, such as mastic and copal resins, can be employed, as is known. A thermoplastic photoresist layer, which is used instead of a hot-melt adhesive, appropriately has the same composition as the photoresist layer of the dry resist material.

The dry photoresist materials which are provided with covering disks according to the present invention are known in the art and are described, for example, in German Offenlegungsschriften Nos. 20 64 079, 23 63 806, 21 23 702, 28 22 190 and 31 34 123. As mentioned above, the materials generally comprise a dimensionally stable support film, a photopolymerizable layer and a covering film. The support film preferably has a thickness in the range from about 15 to about 30 $\mu$m, and the covering film has a thickness from about 5 to about 25 $\mu$m. The principal constituents of the photopolymerizable layer comprise a thermoplastic polymeric binder, polymerizable compounds, which are preferably acrylic or methacrylic acid esters of polyhydric aliphatic hydroxyl compounds, and a photopolymerization initiator. Other customary components may comprise polymerization inhibitors, dyes, pigments, plasticizers and crosslinking agents. The thickness of the layer is generally in the range of between about 10 and about 100 $\mu$m, preferably between about 15 and about 70 $\mu$m.

In the following examples, preferred embodiments of the invention are described. Parts by weight (p.b.w.) and parts by volume (p.b.v.) are related as grams to cm$^3$. Unless otherwise indicated, percentages and quantitative ratios relate to units by weight.

EXAMPLE 1

A 110 cm wide web of a 23 $\mu$m thick biaxially stretched and heat-set polyethylene terphthalate film was coated with a 40 $\mu$m thick photopolymerizable layer having the following composition:
6.5 p.b.w. of a terpolymer of n-hexylmethacrylate, methacrylic acid and styrene (60:30:10) having a mean molecular weight of about 35,000, 2.8 p.b.w. of a polymerizable diurethane, obtained by reacting 1 mole of 2,2,4-trimethylhexamethylene diisocyanate with 2 moles of hydroxyethylmethacrylate, 2.8 p.b.w. of a polymerizable polyurethane obtained from 11 moles of 2,2,4-trimethylhexamethylene diisocyanate, 10 moles of triethylene glycol and 2 moles of hydroxyethylmethacrylate, 0.2 p.b.w. of 9-phenyl-acridine, 0.1 p.b.w. of 3-mercapto-propionic acid-2,4-dichloroanilide, 0.035 p.b.w. of a blue azo dye obtained by coupling 2,4-dinitro-6-chloro-benzene-diazonium salt with 2-methoxy-5-acetylamino-N-cyanoethyl-N-hydroxyethylaniline and 2.8 p.b.w. of 4-hydroxy-benzoic acid-(2-ethylhexyl) ester.

An approximately 12 μm thick polyethylene film was then applied by laminating to the surface of the dry layer, in a continuous operation. The laminate obtained was stored in a large-size roll. By means of a roll slitter, the dry resist film was cut into 45 cm wide webs and wound up into rolls having web lengths of 200 m, using winding mandrels which had diameters of 7.5 cm and extended over each end of the rolls by about 1 cm.

Two annular sleeves which fitted over the ends of the winding mandrels were punched from an adhesive-coated film to cover the end faces of a film roll. The outer circumference of each covering sleeve was provided with a projecting lug which was not coated with adhesive. The sleeves were firmly pressed against the end faces of the roll, using a hand roller. After storing for one month at a temperature of 15° C., the sleeves were detached by means of their projecting lugs and examined. The adhesive surfaces did not show virtually any layer substance, which is easily discernable by its blue color.

Another roll, the end faces of which were covered in the same way, was stored in a heating cabinet for five days at 35° C. Minor traces of layer substance were observed on the adhesive surfaces of the detached sleeves. The end faces of the roll itself were completely free from any squeezed out or spread layer substance.

Still another roll was stored for five days at 45° C., without covering sleeves. An examination of the end faces showed that, in places, considerable amounts of layer substance had emerged and spread across the individual layers in the roll. When unwinding the roll in the laminating device and also when separating the covering film from the photoresist layer, this squeezed out layer substance gave rise to trouble, for example, tearing of the photoresist layer or adherence of this layer to the covering film.

EXAMPLE 2

As described in Example 1, a polyester film was coated with a 45 μm thick layer of the following composition:

2.8 p.b.w. of a terpolymer of methylmethacrylate, n-hexylmethacrylate and methacrylic acid (75:375:90) having an acid number of 209, 2.8 p.b.w. of an unsaturated diurethane, obtained by reacting 1 mole of 2,2,4-trimethyl-hexamethylene diisocyanate with 2 moles of hydroxyethylmethacrylate, 0.2 p.b.w. of 9-phenyl-acridine, 0.25 p.b.w. of triethyleneglycol diacetate and 0.03 p.b.w. of tris-[4-(3-methyl-phenylamino)phenyl]-methylacetate.

The layer was laminated with a polyethylene film and the laminate obtained was processed into rolls having a width of 45 cm, as in Example 1. Appropriate sleeves were punched from a 1 mm thick paper board, coated with a commercial contact adhesive and glued on the end faces of a roll, with the application of pressure. The roll substantially kept its shape, even in the case of improper storage with unevenly supported end faces. In use, the roll was placed in a laminating device without detaching the sleeves. The dry resist film could readily be pulled from the roll and processed in the customary manner. The covering sleeves which had remained on the roll prevented squeezing out of the photoresist layer, even in the case of prolonged interruptions of processing.

The covering sleeves can also be comprised of plastic disks carrying an adhesive tape with a double side adhesive coating. The diameter of the covering sleeves can also be greater than the diameter of the resist roll.

When a dry resist roll manufactured in the same way but having no covering sleeves was stored for a few weeks, as indicated above, while being unevenly supported, the layers in the roll became displaced in telescope-like fashion, such that it was no longer possible to insert the roll into the intended processing equipment.

What is claimed is:

1. A photopolymerizable recording material in the form of a roll having end faces, the recording material comprising:

a removable support film;

a photopolymerizable photoresist layer applied to the support film;

a flexible covering film applied to the exposed surface of the photoresist layer, said flexible covering film adhering less firmly to said photoresist layer than does said support film; and means independent of said photoresist layer for preventing exuding of the photoresist layer at the roll end faces, said means comprising a separate, annular covering disk adhered to each end face of the roll, each of said covering disks comprising an adhesive-coated paper material, textile sheet or film sheet having its adhesive-coated side adhered to one of said roll end faces, wherein said support film is flexible, transparent and dimensionally stable, and wherein said photoresist layer is thermoplastic and transferable from said support film.

2. A recording material as claimed in claim 1, wherein the covering disks are selected from the group consisting of adhesive-coated flexible paper, textile sheets and film sheets.

3. A recording material as claimed in claim 2, wherein said covering disks are adhesive coated film sheets, said sheets selected from the group consisting of polyester, polyethylene, polypropylene, and polyvinyl chloride.

4. A recording material as claimed in claim 2, wherein the adhesive coat comprises a hot-melt adhesive.

5. A recording material as claimed in claim 4, wherein said hot melt adhesive is selected from the group consisting of polyvinyl acetate, a vinyl acetate copolymer, an acrylic ester polymer, polybutene, polyethylene, a copolyester of isophthalic and terephthalic acids, mastic resin and copal resin.

6. A recording material as claimed in claim 2, wherein the adhesive coat comprises a pressuresensitive adhesive.

7. A recording material as claimed in claim 1, wherein the covering disks are rigid.

8. A recording material as claimed in claim 1, wherein said support film is biaxially stretched and heat set polyethylene terephthalate having a thickness of from about 15 μm to about 30 μm.

9. A recording material as claimed in claim 1, wherein said flexible covering film has a thickness of from about 5 μm to about 25 μm.

10. A recording material as claimed in claim 1, wherein said photopolymerizable photoresist layer includes a thermoplastic binder, at least one polymerizable compound selected from the group consisting of an acrylic and a methacrylic acid ester of a polyhydric aliphatic hydroxyl compound, and a photopolymerization initiator.

11. A recording material as claimed in claim 7, wherein said covering disks comprise rigid paper board.

* * * * *